United States Patent
Ball

[11] Patent Number: 5,952,725
[45] Date of Patent: *Sep. 14, 1999

[54] STACKED SEMICONDUCTOR DEVICES

[75] Inventor: Michael B. Ball, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/784,830

[22] Filed: Jan. 17, 1997

Related U.S. Application Data

[60] Division of application No. 08/650,429, May 20, 1996, abandoned, which is a continuation-in-part of application No. 08/602,503, Feb. 20, 1996.

[51] Int. Cl.⁶ .......................... H01L 23/48; H01L 23/52; H01L 29/40
[52] U.S. Cl. .................. 257/777; 257/686; 438/458; 438/464; 438/114
[58] Field of Search ................................ 257/777, 686, 257/783, 675, 690

[56] References Cited

U.S. PATENT DOCUMENTS

| | | | |
|---|---|---|---|
| 4,264,917 | 4/1981 | Ugon | 257/787 |
| 4,472,875 | 9/1984 | Christian et al. | 29/577 |
| 4,826,787 | 5/1989 | Muto et al. | 437/208 |
| 4,862,245 | 8/1989 | Pashby et al. | 257/666 |
| 5,012,323 | 4/1991 | Farnworth | 257/723 |
| 5,019,943 | 5/1991 | Fassbender et al. | 257/777 |
| 5,051,865 | 9/1991 | Kato | 257/686 |
| 5,104,820 | 4/1992 | Go et al. | 437/51 |
| 5,146,308 | 9/1992 | Chance et al. | 257/782 |
| 5,147,815 | 9/1992 | Casto | 257/666 |
| 5,229,647 | 7/1993 | Gnadinger | 257/686 |
| 5,239,198 | 8/1993 | Lin et al. | 257/787 |
| 5,252,857 | 10/1993 | Kane et al. | 257/686 |
| 5,266,833 | 11/1993 | Capps | 257/690 |
| 5,291,061 | 3/1994 | Ball | 257/686 |
| 5,323,060 | 6/1994 | Fogal et al. | 257/783 |

(List continued on next page.)

FOREIGN PATENT DOCUMENTS

| | | | |
|---|---|---|---|
| 56-62351 | 5/1981 | Japan . | |
| 62-126661 | 6/1987 | Japan . | |
| 63-104343 | 5/1988 | Japan . | |
| 63-179537 | 7/1988 | Japan | 437/208 |
| 64-28856 | 1/1989 | Japan . | |
| 1-303730 | 12/1989 | Japan . | |
| 3-169062 | 7/1991 | Japan . | |
| 3-255657 | 11/1991 | Japan | 257/777 |
| 4-76946 | 3/1992 | Japan | 257/777 |

*Primary Examiner*—Olik Chaudhun
*Assistant Examiner*—Phat X. Cao
*Attorney, Agent, or Firm*—Trask, Britt & Rossa

[57] ABSTRACT

A method for increasing integrated circuit density comprising stacking an upper wafer and a lower wafer, each of which have fabricated circuitry in specific areas on their respective face surfaces. The upper wafer is attached back-to-back with the lower wafer with a layer of adhesive applied over the back side of the lower wafer. The wafers are aligned so as to bring complimentary circuitry on each of the wafers into perpendicular alignment. The adhered wafer pair is then itself attached to an adhesive film to immobilize the wafer during dicing. The adhered wafer pair may be diced into individual die pairs or wafer portions containing more than one die pair. At least one face side of the die pair (attachment side) may have an array of minute solder balls or small pins disposed thereon for attachment and electrical communication of the die to at least one substrate such as a printed circuit board or leadframe. The die pair face opposite the substrate attachment side (opposing side) and may have a plurality of bond pads. Bond wires or TAB leads are attached between bond pads on the opposing side and corresponding conductive trace or lead ends on the substrate. Alternately, both the attachment side and opposing side may have an array of minute solder balls or small pins for respective attachment to two facing substrates on opposite sides of the die pair.

8 Claims, 6 Drawing Sheets

U.S. PATENT DOCUMENTS

| | | | |
|---|---|---|---|
| 5,331,235 | 7/1994 | Chun | 257/777 |
| 5,399,898 | 3/1995 | Rostoker | 257/777 |
| 5,422,435 | 6/1995 | Takiar et al. | 257/686 |
| 5,426,072 | 6/1995 | Finnila | 437/208 |
| 5,432,681 | 7/1995 | Linderman | 257/686 |
| 5,438,224 | 8/1995 | Papageorge et al. | 257/686 |
| 5,466,634 | 11/1995 | Beilstein, Jr. et al. | 437/180 |
| 5,471,369 | 11/1995 | Honda et al. | 257/686 |
| 5,483,024 | 1/1996 | Russell et al. | 257/666 |
| 5,484,959 | 1/1996 | Burns | 257/666 |
| 5,495,398 | 2/1996 | Takiar et al. | 361/790 |
| 5,547,906 | 8/1996 | Badehi | 437/227 |
| 5,567,654 | 10/1996 | Beilstein, Jr. et al. | 437/209 |
| 5,675,180 | 10/1997 | Pedersen et al. | 257/685 |

STACKED SEMICONDUCTOR DEVICES

This is a division of application Ser. No. 08/650,429, filed May 20, 1996 abandoned which is a continuation-in-part of application Ser. No. 08/602,503, filed Feb. 20, 1996.

BACKGROUND OF THE INVENTION

1. Field of the Invention

The present invention relates to an apparatus and a method for increasing semiconductor device density. In particular, the present invention relates to a method for producing vertically superimposed multi-chip devices usable with combined flip chip, wire bond, and/or tape automated bonding ("TAB") assembly techniques to achieve densely packaged semiconductor devices.

2. State of the Art

Definitions: The following terms and acronyms will be used throughout the application and are defined as follows:

BGA - Ball Grid Array: An array of minute solder balls disposed on an attachment surface of a semiconductor die wherein the solder bals are refluxed for simultaneous attachment and electrical communication of the semiconductor die to a printed circuit board. A BGA may also employ conductive polymer balls.

COB - Chip On Board: The techniques used to attach semiconductor dice to a printed circuit board, including flip chip attachment, wirebonding, and TAB.

Flip Chip: A chip or die that has a pattern or array of terminations spaced around the active surface of the die for face down mounting of the die to a substrate.

Flip Chip Attachment: A method of attaching a semiconductor die to a substrate in which the die is inverted so that the connecting conductor pads on the face of the device are set on mirror-image pads on the substrate (such as a printed circuit board), and bonded by solder reflux or a conductive polymer curing.

Glob Top: A glob of encapsulant material (usually epoxy or silicone or a combination thereof) surrounding a semiconductor die in a COB assembly.

PGA - Pin Grid Array: An array of small pins extending substantially perpendicular from the major plane of a semiconductor die, wherein the pins conform to a specific arrangement on a printed circuit board or other substrate for attachment thereto.

SLICC - Slightly Larger than Integrated Circuit Carrier: An array of minute solder balls disposed on an attachment surface of a semiconductor die similar to a BGA, but having a smaller solder ball pitch and diameter than a BGA.

TAB - Tape Automated Bonding. Conductive traces are formed on a dielectric film such as a polyimide (the structure also being termed a "flex circuit"), and the film is precisely placed to electrically connect die and a circuit board or leadframe through the traces. Multiple connections are simultaneously effected.

State-of-the-art COB technology generally consists of three semiconductor die-to-printed circuit board conductive attachment techniques: flip chip attachment, wirebonding, and TAB.

Flip chip attachment consists of attaching a semiconductor die, generally having a BGA, an SLICC or a PGA, usually to a printed circuit board, although flip chip attachment to leadframes is also known. With the BGA or SLICC, the solder or other conductive ball arrangement on the semiconductor die must be a mirror-image of the connecting bond pads on the printed circuit board such that precise connection is made. The semiconductor die is bonded to the printed circuit board, such as by refluxing the solder balls or curing the conductive polymer. With the PGA, the pin arrangement of the semiconductor die must be a mirror-image of the pin recesses on the printed circuit board. After insertion, the semiconductor die is generally bonded by soldering the pins into place. An under-fill encapsulant is generally disposed between the semiconductor die and the printed circuit board for environmental protection and to enhance the attachment of the die to the board. A variation of the pin-in-recess PGA is a J-lead PGA, wherein the loops of the J's are soldered to pads on the surface of the circuit board.

Wirebonding and TAB attachment generally begins with attaching a semiconductor die, usually by its back side, to the surface of a printed circuit board with an appropriate adhesive, such as an epoxy. In wirebonding, a plurality of bond wires are attached, one at a time, to each bond pad on the semiconductor die and extend to a corresponding lead or trace end on the printed circuit board. The bond wires are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. The die may be oriented either face up or face down (with its active surface and bond pads either up or down with respect to the circuit board) for wire bonding, although face up orientation is more common). With TAB, ends of metal leads carried on an insulating tape such as a polyimide are attached to the bond pads on the semiconductor die and to corresponding lead or trace ends on the printed circuit board. An encapsulant is generally used to cover the bond wires and metal tape leads to prevent contamination; TAB assemblies may be similarly encapsulated.

Higher performance, lower cost, increased miniaturization of components, and greater packaging density of integrated circuits are ongoing goals of the computer industry. Greater integrated circuit density is primarily limited by the space or "real estate" available for mounting dice on a substrate such as a printed circuit board. Conventional leadframe design inherently limits package density for a given die size because the die-attach paddle of the leadframe must be larger than the die to which it is bonded. The larger the die, the less space that remains around the periphery of the die-bonding pad for wire bonding. Furthermore, the wire bonding pads on the standard leadframe provide anchorage for the leads when the leads and the die are encapsulated in plastic. Therefore, as the die size is increased in relation to a given package size, there is a corresponding reduction in the lateral depth along the sides of the package for the encapsulating plastic which joins the top and bottom of the plastic body at the mold part line and anchors the leads. Thus, as the leads and encapsulant are subjected to the normal stresses of subsequent trimming, forming and assembly operations, the encapsulating plastic may crack, compromising package integrity and substantially increasing the probability of premature device failure.

A so-called "leads over chip" (LOC) arrangement eliminates the die-attach paddle of the leadframe and supports the die by its active surface from the inner lead ends of the leadframe. This permits a wider variety of bond pad patterns on the die, extends the leads-to-encapsulant bond area and, with appropriate design parameters, can reduce the size of the packaged device for a given die size.

One method of increasing integrated circuit density is to stack dice vertically. U.S. Pat. No. 5,012,323 issued Apr. 30, 1991 to Farnworth teaches combining a pair of dice mounted on opposing sides of a leadframe. An upper, smaller die is backbonded to the upper surface of the leads of the leadframe via a first adhesively coated, insulated film layer. A lower, larger die is face-bonded to the lower leadframe die-bonding region via a second, adhesively coated, insulative film layer. The wire-bonding pads on both upper dice and lower dice are interconnected with the ends of their associated lead extensions with gold or aluminum bond wires. The lower die must be slightly larger than the upper die so that the die pads are accessible from above through a bonding window in the leadframe such that gold wire connections can be made to the lead extensions. This arrangement has a major disadvantage from a production standpoint, since the different size dice require that different equipment produce the different dice or that the same equipment be switched over in different production runs to produce the different dice.

U.S. Pat. No. 5,229,647 issued Jul. 20, 1993 to Gnadinger teaches stacking wafers and using non-mechanically bonded electrical connections effected by metal-filled through holes contacting aligned conductive bumps of an adjacent wafer.

U.S. Pat. No. 5,291,061 issued Mar. 1, 1994 to Ball teaches a multiple stacked die device containing up to four stacked dice supported on a die-attach paddle of a leadframe, the assembly not exceeding the height of current single die packages, and wherein the bond pads of each die are wirebonded to lead fingers. The low profile of the device is achieved by close-tolerance stacking which is made possible by a low-loop-profile wirebonding operation and thin adhesive layers between the stacked dice.

U.S. Pat. No. 5,323,060 issued Jun. 21, 1994 to Fogal et al. teaches a multichip module that contains stacked die devices, the terminals or bond pads of which are wirebonded to a substrate or to adjacent die devices.

U.S. Pat. No. 5,422,435 to Takiar et al. teaches stacked dice having wire bonds extending to each other and to the leads of a carrier member such as a leadframe.

U.S. Pat. No. 5,399,898 issued May 21, 1995 to Rostoker teaches multichip, multitier semiconductor arrangements based on single and double-sided flip-chips. Using these dice to form a stacked dice package eliminates the need for wirebonding and thus reduces the size of the stacked dice package. However, these dice stacks require double-sided flip-chips which are expensive and difficult to manufacture.

See also U.S. Pat. Nos. 5,146,308; 5,252,857; and 5,266,833 for additional background regarding die configurations and assemblies employing dice.

Therefore, it would be advantageous to develop a technique and assembly for increasing integrated circuit density using non-customized die configurations in combination with commercially-available, widely-practiced semiconductor device fabrication techniques.

SUMMARY OF THE INVENTION

The present invention relates to a method for increasing integrated circuit density. The method comprises providing a pair of semiconductor wafers which are each provided on a face side with a desired integrated circuit pattern by techniques known in the industry. The completed wafers are then mounted back-to-back by a layer of adhesive material such that the back or blank sides face one another and the circuit-carrying or active sides face outward. The layer of adhesive, in some instances an electrically insulative adhesive as required or desired to electrically isolate back-to-back adjacent dice, is applied over the back side of one wafer. The back side of the other wafer is placed on the adhesive, thereby attaching the wafers back-to-back to form a two-wafer stack. Depending on the adhesive, the assembly may be cured (as in the case of a thermosetting adhesive) to affix the wafers together. It is, of course, that understood the other types of adhesives not requiring a cure, such as pressure sensitive adhesives, could be used to hold the wafers back-to-back.

Generally, the wafers define identical die sizes, shapes and locations to facilitate singulation after assembly, and may include identical circuitry and bond pad arrangements on their respective dice, although this is not required. One technique for precisely aligning the wafers is to employ the wafer flats. It is, of course, understood that the more complex techniques such as pattern recognition systems could be employed to align the wafers through recognition of surface features and markings.

Once the wafers are aligned and adhered, the wafer stack is mounted onto a stretchable adhesive film carried by a frame, as known in the art. The adhesive film frame is used to immobilize the wafer stack for scribing or sawing to singulate the dice or excise portions or segments of the wafers, sawing being highly preferred over scribing due to the double thickness of the wafer stack. The wafer stack/film frame assembly is then sent through a dicing or singulation procedure wherein individual stacked dice pairs or wafer portions containing groups of dice pairs are cut from the wafer stack using a wafer dicing saw. The "streets" of the front and back wafers of the stack are, of course, aligned such that the circuitry on both wafers is not damaged during the dicing process.

It is, of course, understood that the above alignment, adherence and separation process can be employed using portions of wafers rather than full wafers, although this is not preferred and may be impractical since handling and sawing equipment is generally designed to accommodate full wafers, and proceeding at less than wafer level may be economically undesirable.

After the paired dice or wafer portions are removed from the wafer stack and adhesive film frame by a pick-and-place apparatus as known in the art, the film being stretched to enhance separation of component parts of the wafer at the sawing, they may be attached to a carrier substrate, such as a PCB or leadframe. A lower die of the dice pair is preferably configured as a flip chip having, for example, BGA or SLICC solder bump connections, conductive polymer bumps, pin connections (PGA), or surface mount J-lead connections extending substantially perpendicular from the circuitry face of the lower die for attachment and electrical communication of the die to the carrier substrate. The substrate is configured with a specific lead end or trace end pattern compatible with the specific pin out or bump connections on the lower die.

An upper die of the dice pair can be used to align the dice pair to the substrate. The use of the upper die for alignment allows the dice pair to be placed within plus or minus 0.0002–0.0003 inch of the desired location. Optical alignment systems, including without limitation pattern recognition systems as known in the art, are suitable to effect alignment to such tolerances. Once the dice pair is attached, an under-fill encapsulant is generally disposed between the lower die and the substrate (if other than a leadframe) for environmental protection and to enhance the attachment of the dice pair to the substrate.

Normally, the circuitry side or active surface of the upper die includes a plurality of bond pads. After attachment of the dice pair to the substrate, the bond pads of the upper die are brought into electrical communication with conductors of the substrate with wire bonds or TAB attachment. Bond wires and TAB traces of gold, aluminum or other suitable materials as known in the art are attached between the upper die bond pads and corresponding trace ends or lead ends of the substrate. If the die stack resides on a solid substrate such as a PCB, an encapsulant such as a glob-top is generally used to cover the bond wires or flex circuit to prevent contamination. If the die pair is secured to a leadframe, the assembly may be plasticencapsulated as known in the art, as by transfer molding. Of course, preformed ceramic or metal packaging as known in the art may also be employed.

It is, of course, also understood that both the upper and lower dice may be flip chips having an array of minute solder balls or small pins for respective attachment to two opposing substrates such as facing PCB's or leadframes, or to a two-piece leadframe as known in the art.

The method of the invention increases semiconductor device density using noncustomized die and bond pad patterns and commercially-practiced mechanical and electrical attachment techniques.

It will also be recognized by those skilled in the art that the stacked wafers may be employed as a wafer level assembly, as in the case where extremely large memory capacity is required.

It will also be appreciated that, while the wafers have been described as adhered back-to-back, face-to-back adherence is also possible, that more than two wafers may be adhered with the use of appropriately-placed bond pads and that chamfering, undercutting or notching of the upper wafer edges may be effected to access lower wafer peripheral bond pads.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENT

Figure 1:
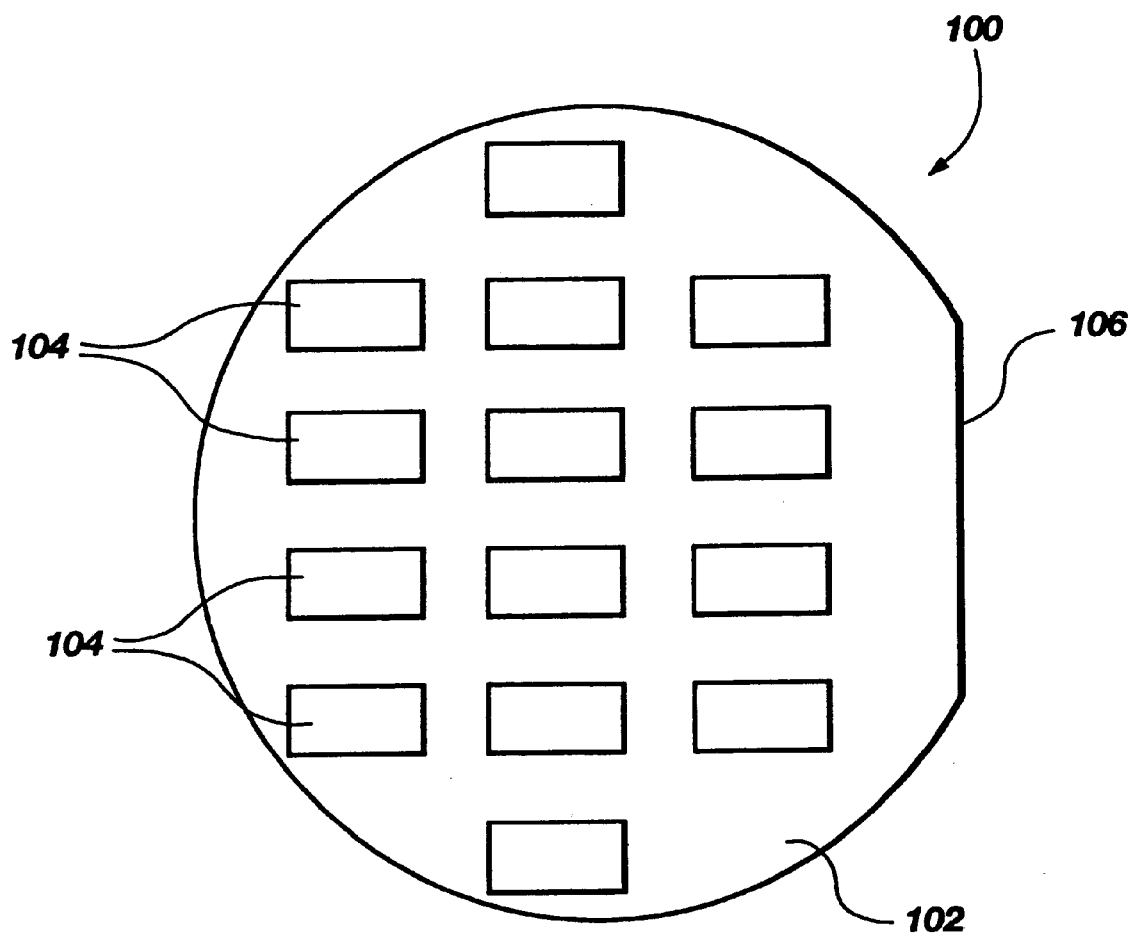
FIG. 1 is a top plan view of an etched wafer.

FIG. 1 illustrates a top plan view of an exemplary completed wafer 100 of the present invention. The wafer 100 comprises an upper surface 102 displaying the active sides of a plurality of dice 104. The dice 104 each contain identical integrated circuitry which will be independently functional after dice are separated from the wafer. While in practice, the dice 104 are extremely closely packed on the wafer and essentially contiguous, but for the wafer material sacrificed during sawing, the dice 104 have been shown as more widely spaced for clarity in disclosure of the method of the invention. The wafer 100 also includes a flat lateral edge 106, as known in the art. The method of the present invention comprises fabricating appropriate circuitry in the upper wafer surface 102 at the locations of the dice 104 by techniques well known in the industry.

Figure 2:
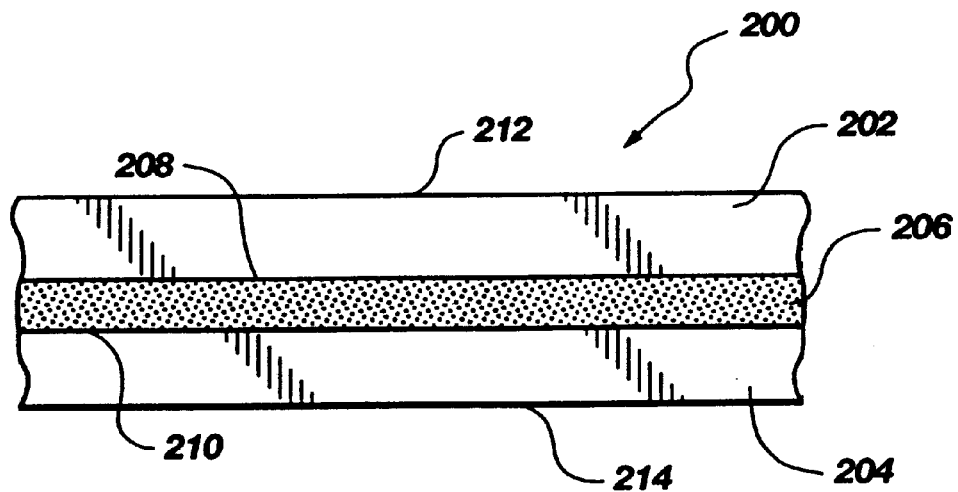
FIG. 2 is a side plan view of an adhered wafer pair.

As shown in FIG. 2, a wafer pair assembly 200 comprises completed wafers 202 (upper wafer) and 204 (lower wafer) secured with an adhesive 206 disposed between the upper wafer 202 and the lower wafer 204. The wafer mounting arrangement is such that a back side 208 of upper wafer 202 and a back side 210 of lower wafer 204 face one another and a circuitry or active surface 212 of the upper wafer 202 and a circuitry or active surface 214 of the lower die 204 face outward.

Preferably, the upper wafer 202 and the lower wafer 204 contain complementary die locations, sizes, shapes and orientations such that when the wafers 202 and 204 are mounted, the dice of one wafer vertically align with that of the other. One technique for precisely aligning the wafers is to fabricate each wafer in such a manner that aligning the wafer flats 106 (FIG. 1) automatically aligns the dice and circuitry. It is, of course, understood that the more complex techniques such as a pattern recognition system could be employed to precisely align the wafers.

Figure 3:
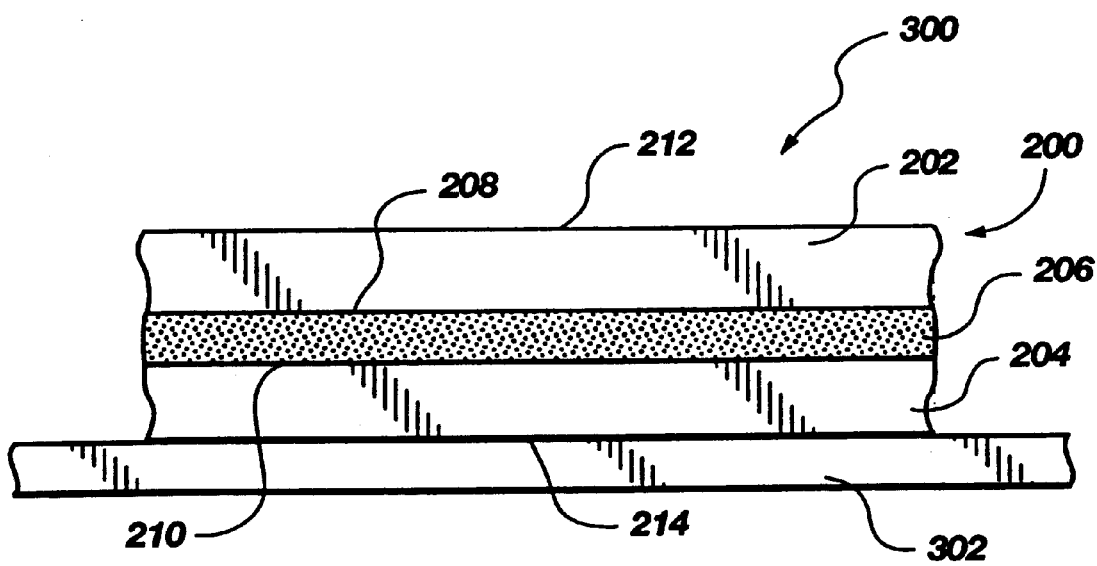
FIG. 3 is a side plan view of the wafer pair of FIG. 2 attached to the adhesive film frame.

FIG. 3 illustrates a side plan view of an immobilized wafer assembly 300 comprising the wafer pair 200 of FIG. 2 attached to an adhesive film 302. Components common to FIGS. 1, 2 and 3 retain the same numeric designation. After the upper wafer 202 and lower wafer 204 are aligned and mutually adhered with adhesive 206, the wafer pair 200 is mounted onto the adhesive film 302 carried by a frame (not shown). The adhesive film 302 is used to immobilize the wafer pair 200. This immobilization prevents the movement of the wafer pair 200 when the immobiized assembly 300 is sent through a separation or singulation procedure, which may cut individual stacked dice pairs or groups of dice pairs (or other wafer portions) from the wafer pair 200 using a wafer dicing saw (not shown) as known in the art for cutting single wafers.

Figure 4:
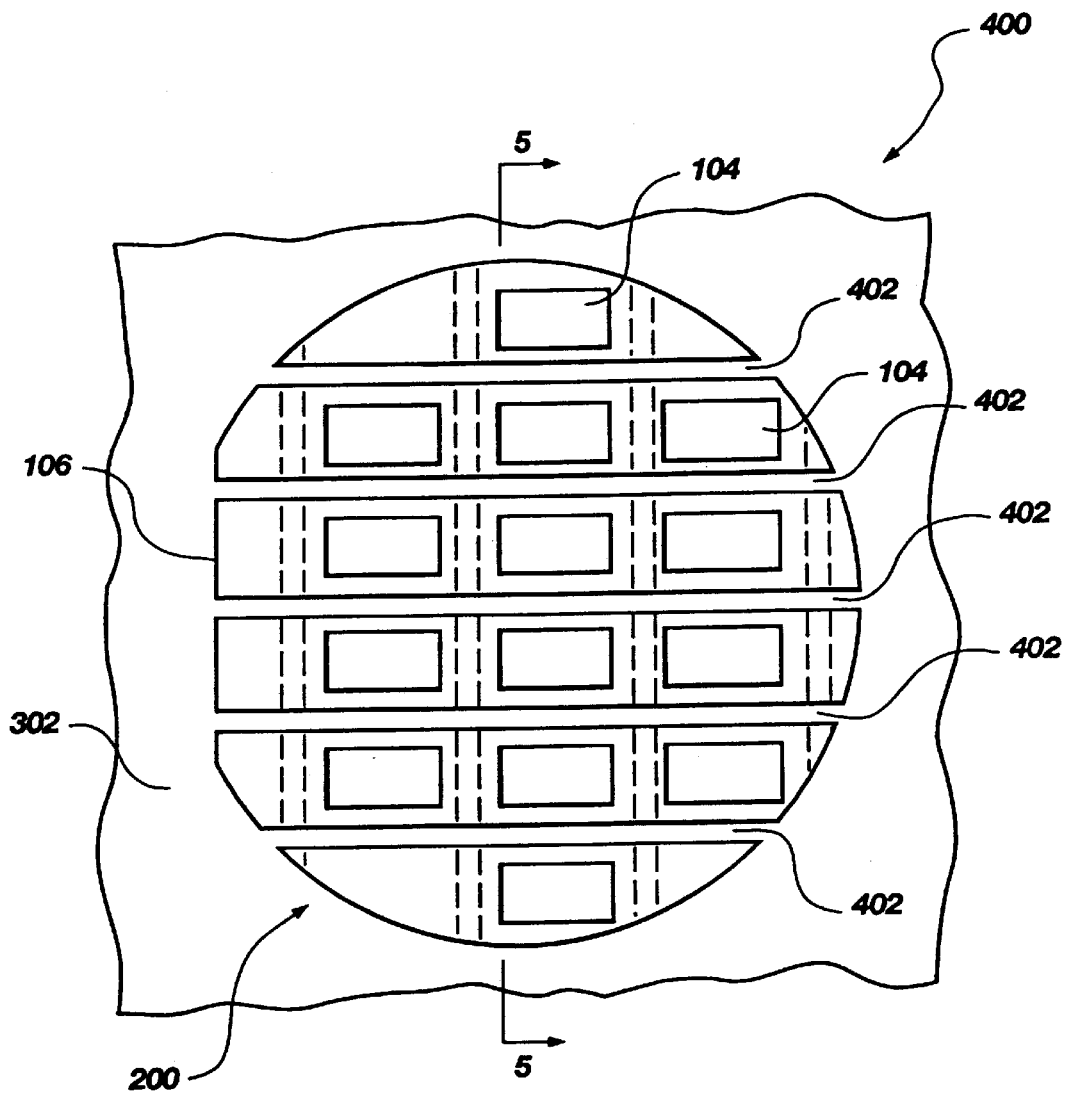
FIG. 4 is a top plan view of the wafer pair of FIG. 3 after dicing.
Figure 5:
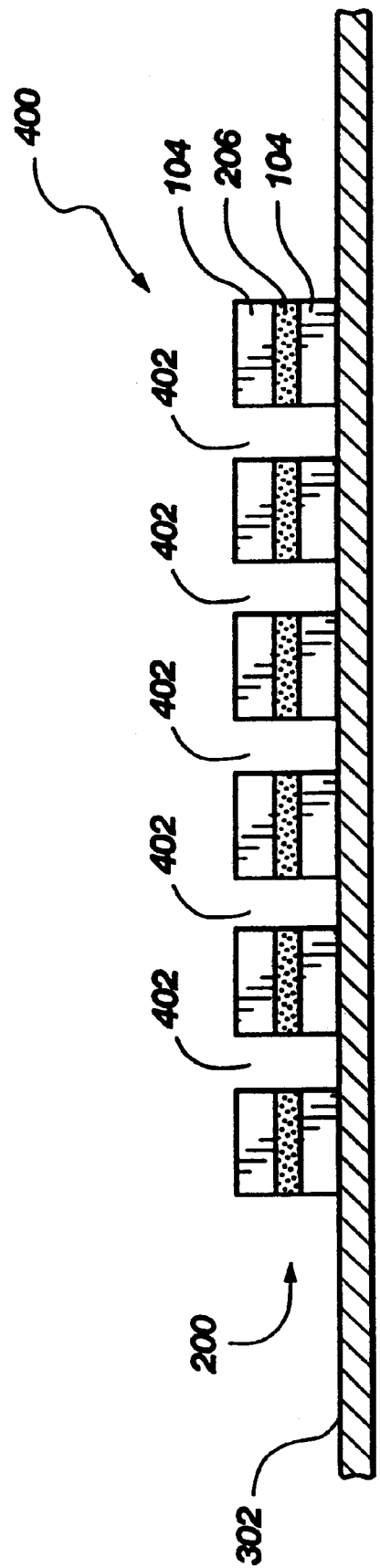
FIG. 5 is a side cross sectional view of the wafer pair along line 5—5 of FIG. 4.

FIG. 4 illustrates a top plan view of a partially kerfed or sawed wafer pair assembly 400. FIG. 5 illustrates a side cross sectional view along line 5—5 of FIG. 4. Components common between FIGS. 1–5 retain the same numeric designation. The partially kerfed wafer pair assembly 400 shows the wafer pair 200 immobilized on the adhesive film 302 after pass of a wafer dicing saw in one direction creating parallel kerfs 402. The wafer dicing saw is, per normal practice, preferably set to cut substantially through the wafer pair 200 without cutting the adhesive film frame 302 (see FIG. 5). If the dice 104 are to be singulated as dice pairs for use, the partially kerfed assembly 400 is rotated 90° and cut in the transverse direction (see broken lines on FIG. 4) with parallel saw cuts, again as known in the art for cutting single wafers.

After the pairs of dice or wafer portions are cut and removed from the adhesive film by a pick-and-place apparatus or other known in the art, they may be attached to a substrate or printed circuit board. At least one side of the dice pair will preferably have an array of minute solder balls or other conductive elements (BGA or SLICC) or an array of small pins (PGA) disposed thereon for face-down attachment and electrical communication of the die to at least one substrate, again such as a PCB or leadframe.

The die surface which is opposite to the die surface being attached to the substrate can be used to align the dice pair. As noted previously, the alignment technique allows the dice pair to be placed within plus or minus 0.0002–0.0003 inch of the desired location.

Figure 6:
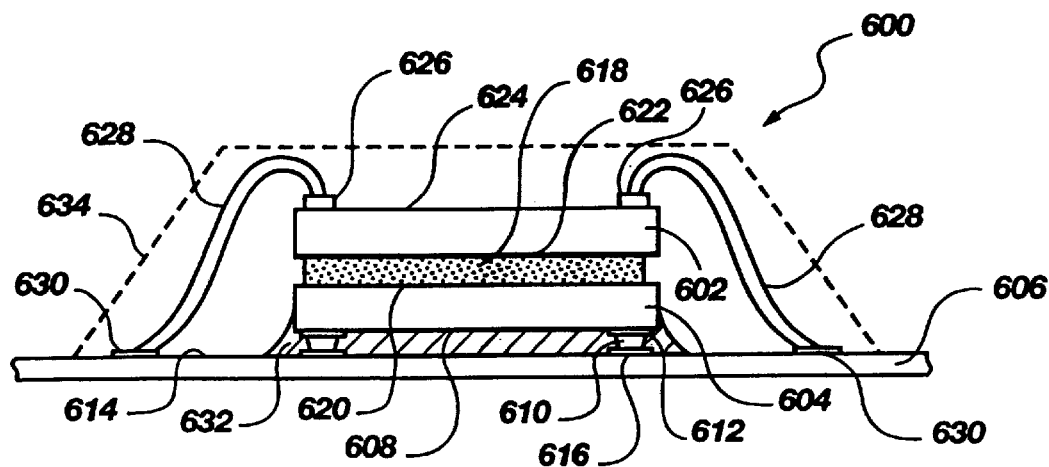
FIG. 6 is a side plan view of a die assembly of the present invention.

FIG. 6 illustrates an exemplary die assembly 600 of the present invention. The assembly 600 comprises an upper die 602 and an opposing lower die 604 which is connected to a leadframe or other substrate 606. Fabrication of the assembly 600 comprises providing the lower die 604 having a face surface 608 with at least one flip chip electric connection 610 (such as a C4 solder bump connection, conductive polymer bump or pin connection, these and other alternatives being known in the art, by way of example) extending from a bond pad or other terminal 612 on the lower die face surface 608. A back side 622 of the upper die 602 is adhered to the lower die 604 with a layer of adhesive 618 applied over a lower die back side 620, as previously described. An adhesive requiring a curing step, such as an epoxy, is preferred, although many adhesives (thermoplastic, contact, etc.) known in the art are suitable.

The flip chip electric connections 610 are then made to a surface 614 of the substrate 606 in such a manner that the flip chip electric connections 610 provide both mechanical securement and electrical contact with lead ends, trace ends, terminals or other electrical contact elements 616 in or on the surface 614 of the substrate 606.

A face side 624 of the upper die 602 has a plurality of bond pads 626 disposed thereon. A plurality of exemplary gold or aluminum bond wires 628 is shown attached between the upper die bond pads 626 and corresponding trace or lead ends or other terminals 630 on the upper surface 614 of the substrate 606.

Preferably, a sealing (underfill) compound 632 as known in the art is disposed between the lower die 604 and the substrate 606 (if solid rather than a leadframe) to prevent contamination of the flip chip electric connections 610 and to more firmly secure the lower die 604 to the substrate 606. A glob top 634 may be applied over assembly 600 individually as shown in broken lines, or over the entire substrate 606, which may support a plurality of assemblies 600. The subsequently-described embodiments may similarly be glob-topped, as desired. If substrate 606 is a leadframe, the assembly may be packaged in molded plastic or a preformed ceramic or metal package.

Substrate 606, if an insulative substrate, may itself be connected to a chassis or mother board by edge connections, bump connections, pin connections, or other conductive arrangements as known in the art. If substrate 606 is a leadframe, the outer lead ends may engage a higher-level package as known in the art.

Figure 7:
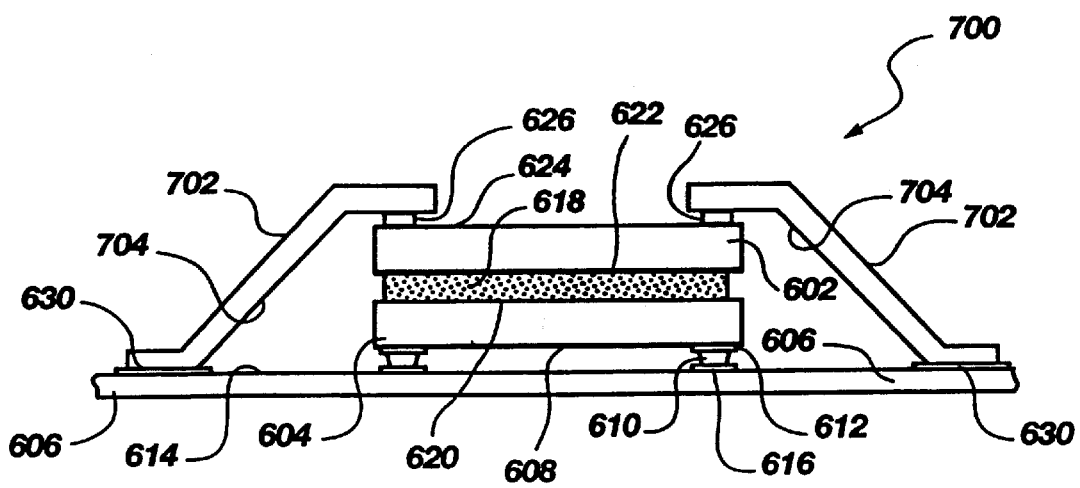
FIG. 7 is a side plan view of an alternative die assembly of the present invention.

FIG. 7 illustrates a side plan view of alternative die assembly 700 of the present invention. FIG. 7 shows a TAB attachment assembly rather than the wirebonding shown in FIG. 6. The alternate die assembly 700 is similar in structure to the die assembly 600 of FIG. 6; therefore, components common to both FIG. 6 and FIG. 7 retain the same numeric designation. A plurality of traces 704 on dielectric TAB films 702 are attached between the upper die bond pads 626 and corresponding trace or lead ends or other terminals 630 on the upper surface 614 of the substrate 606.

Figure 8:
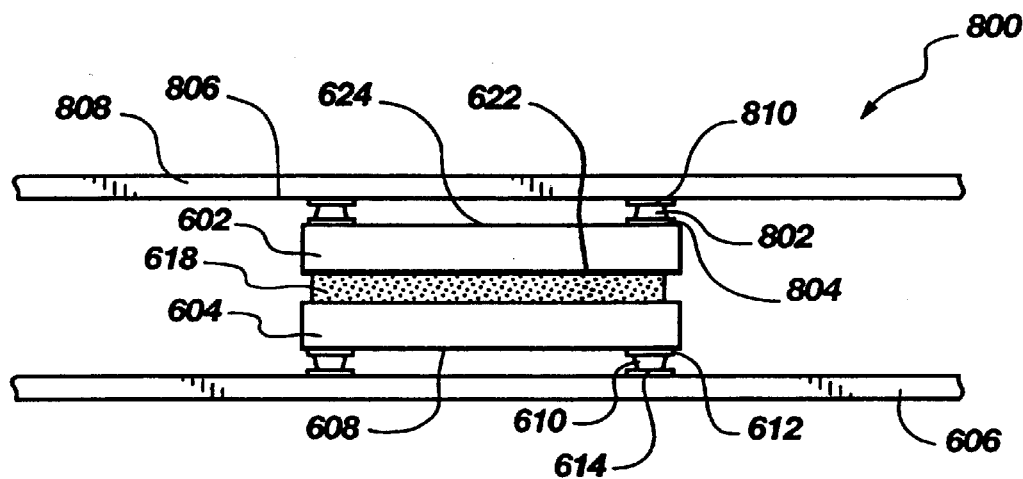
FIG. 8 is a side plan view of another alternative die assembly of the present invention.

FIG. 8 illustrates a side plan view of another alternative die assembly 800 of the present invention. FIG. 8 shows the use of a pair of substrates such as printed circuit boards or leadframes (or two parts of a two-part leadframe) for electrical connection of the adhered dice pair. The die assembly 800 is similar in structure to the die assemblies 600 and 700 of FIGS. 6 and 7, respectively. Therefore, components common between FIGS. 6, 7, and 8 retain the same numeric designation. The upper die 602 has at least one flip chip electric connection 802 on the upper die face surface 624 which extends from a bond pad or other terminal 804 on the upper die face surface 624. The flip chip electric connections 802 extend to a surface 806 of a substrate 808 in such a manner that the flip chip electric connections 802 physically (mechanically) attach to, and make electrical contact with lead ends, trace ends, terminals or other electrical contact elements 810 in or on the surface 806 of the substrate 808.

Figure 9:
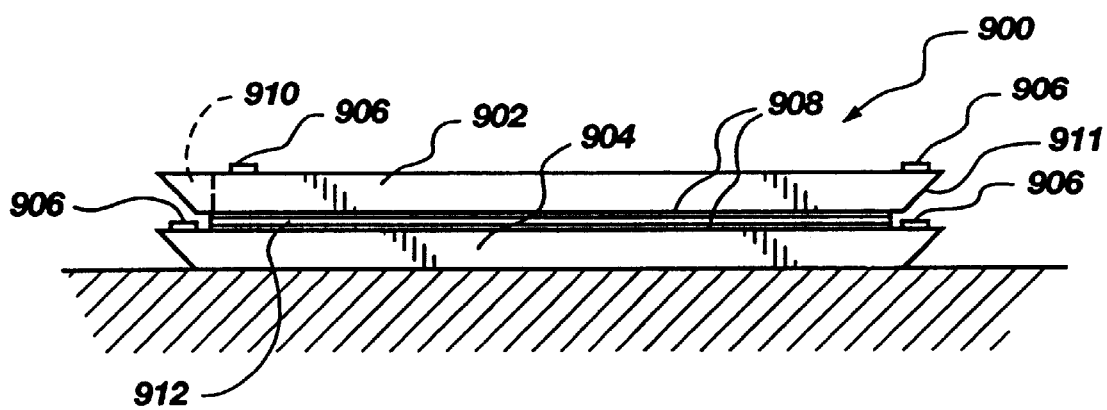
FIG. 9 is a side plan view of an alternative arrangement of an adhered wafer pair according to the invention.

FIG. 9 depicts yet another alternative embodiment 900 of the present invention comprising a die, partial wafer or wafer stack comprising first and second semiconductor substrates 902 and 904, each having bond pads 906 thereon communicating with integrated circuitry on each respective substrate. Unlike the previous embodiments of the invention, semiconductor substrates 902 and 904 are stacked and adhered by adhesive 908 in active face-to-back side relationships. Notches or recesses 910 or chamfers 911 at the semiconductor substrate peripheries expose bond pads 906 on lower substrate 904, of which there may be more than one to provide a three-or-more substrate stack. The notch 910 having an opposing pair of walls extend to a terminating wall 914 substantially perpendicular to a circuitry side 916 and a back side 918 of said semiconductor wafer 902. In accordance with the invention, it is preferred to practice this embodiment at the wafer level for ease of fabrication. It would be preferred to employ an insulating (dielectric) adhesive 908 between wafers in this embodiment, unless a very robust passivation layer is formed over the active surfaces of the lower wafer. Moreover, it may be desirable to employ a heat sink member 912 between the semiconductor substrates 902 and 904, either embedded in the adhesive or located between two adhesive layers, to promote heat transfer from the active surface of lower substrate 904 through an active or passive external cooling system as known in the art.

Having thus described in detail preferred embodiments of the present invention, it is to be understood that the invention defined by the appended claims is not to be limited by particular details set forth in the above description, as many apparent variations thereof are possible without departing from the spirit or scope thereof. For example, if the present invention is to be practiced at the wafer level, the integrated circuitry may be configured and fabricated for wafer-level operation with appropriate conductive traces and bond pad locations, as well as fuse and antifuse elements for removal of circuit segments proven defective during testing and burn-in. Similarly, wafer portions or segments may be designed from the outset as discrete larger circuits, rather than as a plurality of linked discrete die. Again, such a configuration may be more economical of wafer real estate.

What is claimed is:

1. A semiconductor substrate element assembly comprising:
   at least two semiconductor wafer segments adhered together in at least partially vertically superimposed, circuitry side-to-back side relationship;
   said at least two semiconductor wafer segments each having a plurality of bond pads about a periphery thereof; and at least one of said semiconductor wafer segments having at least one other semiconductor wafer segment above it, wherein said at least one other semiconductor wafer segment includes at least one recess through said at least one other semiconductor wafer segment extending between and substantially perpendicular to a circuitry side and a back side of said at least one other semiconductor wafer segment to provide access to at least one said peripheral bond pad of said at least one semiconductor wafer segment.

2. The assembly of claim 1, further including a heat sink element interposed between at least two of said at least two semiconductor wafer segments.

3. The assembly of claim 1, wherein said at least two semiconductor wafer segments comprise full semiconductor wafers.

4. The assembly of claim 3, wherein said at least two semiconductor wafers are vertically aligned by flats thereon.

5. The assembly of claim 1, wherein said at least two semiconductor wafer segments each comprise individual semiconductor dice.

6. The assembly of claim 1, wherein said at least one recess is defined by an opposing pair of walls extending to a terminating wall substantially perpendicular to said circuitry side and said back side of said semiconductor wafer.

7. The assembly of claim 1, wherein said at least one recess comprises at least one notch.

8. The assembly of claim 7, wherein said at least one notch is defined by an opposing pair of walls extending to a terminating line substantially perpendicular to said circuitry side and said back side of said semiconductor wafer.

* * * * *

UNITED STATES PATENT AND TRADEMARK OFFICE
CERTIFICATE OF CORRECTION

PATENT NO. : 5,952,725    Page 1 of 2
DATED : September 14, 1999
INVENTOR(S) : Michael B. Ball It is certified that error appears in the above-identified patent and that said Letters Patent is hereby corrected as shown below:

Title page,
Column 2, bedore "Primary Examiner" insert -- other Documents IBM Technical Disclosure Bulletin, P.F. Iafrate, High Density and Speed Performance Chip Joining Procedure and Package, Vol. 15,No. 4,Pg. 1281. -- ; and
Column 2, under Primary Examiner" change -- Olik "Chaudhun" to -- Chaudhuri --

In the drawings:
In Fig. 9, reference numerals and corresponding indicator lines were inadvertently omitted, please insert -- 914 -- , -- 916 -- and their corresponding lines.

In the specification:

Column 1,
Line 22, delete "bals" and insert -- balls -- therefor;

Column 2,
Line 32, change "common)." to -- common. -- by deleting closing parenthesis;

Column 3,
Line 46, change "dice" (second occurrence) to -- die -- ;
Line 47, change "dice" to die -- ;
Line 48, change "dice" to -- die -- ;

Column 4,
Line 10, change "that understood" to -- understood that --;

UNITED STATES PATENT AND TRADEMARK OFFICE
CERTIFICATE OF CORRECTION

PATENT NO. : 5,952,725
DATED : September 14, 1999
INVENTOR(S) : Michael B. Ball

It is certified that error appears in the above-identified patent and that said Letters Patent is hereby corrected as shown below:

Column 4,
Line 29, delete "water" and insert -- wafer -- therefor;
Line 63, after "including" insert -- , -- and after "limitation" insert -- , --

Column 5,
Line 16, change "plasticencapsulated" to -- platic encapsulated -- ;
Line 52, change "cross sectional" to -- cross-sectional -- ;

Column 6,
Line 4, after "after" insert -- the -- ; and
Line 50, change "cross sectional" to -- cross-sectional -- .

In the claims:

Claim 6, Column 10,
Line 9, insert -- at least one other -- before "semiconductor". And Claim 8, column 10,
Line 15, insert -- at least one other -- before "semiconductor"

Signed and Sealed this

Fourth Day of September, 2001

Attest:

NICHOLAS P. GODICI
Attesting Officer   Acting Director of the United States Patent and Trademark Office